United States Patent

[11] 3,611,250

[72] Inventor Norman Leonard Reed
Aylesbury, England
[21] Appl. No. 856,629
[22] Filed Sept. 10, 1969
[45] Patented Oct. 5, 1971
[73] Assignee AMP Incorporated
Harrisburg, Pa.
[32] Priority Sept. 13, 1968
[33] Great Britain
[31] 43,605/68
Continuation-in-part of application Ser. No. 696,736, Jan. 10, 1968.

[54] INTEGRATED CIRCUIT MODULE AND ASSEMBLY
1 Claim, 2 Drawing Figs.

[52] U.S. Cl. .......... 339/17 CF, 174/68.5, 317/101 CP, 324/158 F, 339/176 MP
[51] Int. Cl. .......... H01r 13/50, H05k 1/00
[50] Field of Search .......... 339/17, 174, 176; 174/DIG. 3, 68.5; 317/101 CP; 324/158 F

[56] References Cited

UNITED STATES PATENTS

| | | | |
|---|---|---|---|
| 3,345,541 | 10/1967 | Cobaugh et al. | 339/17 CF X |
| 3,408,612 | 10/1968 | Bute et al. | 339/17 CF |
| 3,441,853 | 4/1969 | Bodine | 339/17 CF X |

*Primary Examiner*—Marvin A. Champion
*Assistant Examiner*—Terrell P. Lewis
*Attorneys*—Curtis, Morris and Safford, William J. Keating, William Hintze, Frederick W. Raring, John R. Hopkins, Adrian J. LaRue and Jay L. Seitchik

ABSTRACT: An integrated circuit module in which the circuit elements are encapsulated in a block of dielectric material having a number of channels in each of a pair of opposite sides. The leads from the elements extend into the channels, the walls of which protect the leads. The module is designed to be wedged between rows of post contacts fixed in a block with the posts extending along the channels in contact with the leads.

PATENTED OCT 5 1971 3,611,250

Figure 1:
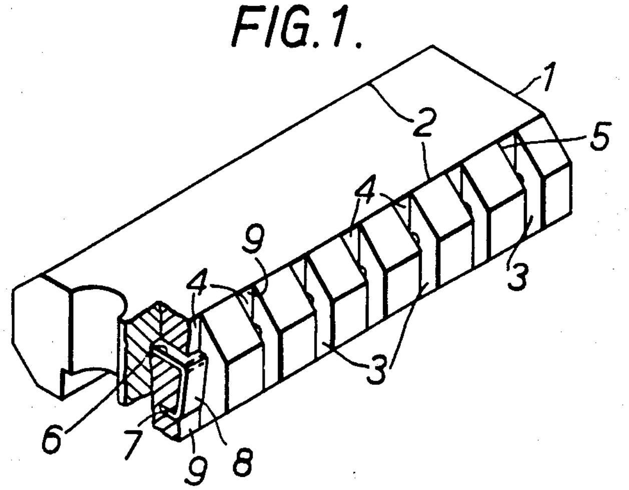

INVENTOR
NORMAN LEONARD REED

BY Adrian J. LaRue

INTEGRATED CIRCUIT MODULE AND ASSEMBLY

CROSS-REFERENCE TO RELATED APPLICATION

This application is a continuation-in-part application of Ser. No. 696,736, filed Jan. 10, 1968.

This invention relates to integrated circuit modules and more particularly to a new and improved integrated circuit module and a carrier therefor.

The invention relates to an integrated circuit module of the type comprising an electric circuit element encapsulated in a block of dielectric material, leads emerging from the circuit element exteriorly of the block for connection to other circuitry. Generally, the block is slablike, the leads extend from the longer sides of the slab and the external portions of the leads are bent to project beyond the block base. The module is connected to other circuitry, for example, a printed circuit, by inserting the leads into receptacles connected into the circuit and arranged in accordance with the pattern of the leads. The leads may be held in the receptacles by resilient contact for the module to be plugged into and unplugged from the circuit.

The modules are fragile and during handling the leads may be deformed out of registration with the receptacles of the circuit and seals between the block and the leads may be broken.

In copending application Ser. No. 696,736, there has been described and claimed an electrical circuit assembly comprising an integrated circuit module mounted on an electrically insulating support, in which the support has channels to receive the respective component leads of the module, the assembly being mounted on an electrically insulating block having electrically conductive posts arranged to extend into the respective channels and overlie and make electrical contact with the leads.

An integrated circuit module, according to the invention, comprises a generally slablike molding of dielectric material formed on opposite sides with projections spaced apart longitudinally of the molding to define channels extending through the thickness of the molding, the bases of the channels on opposite sides of the molding converging to one major surface of the molding, a circuit element encapsulated within the molding, the ends of each lead of the circuit element being contained within the molding, a portion of each lead intermediate the lead ends lying within a respective channel and contiguous with the channel base.

The invention also includes an assembly of such a module received on a generally slablike carrier having two rows of electrically conductive posts spaced apart longitudinally of the carrier, each post having a contact surface inclined at substantially the same inclination as the channel base of the module and in electrical contact with the intermediate portion of a lead of the module.

An object of the invention is to provide an integrated circuit module which protects leads of the electric circuit element molded within the molding.

Another object is the provision of an integrated circuit module wherein free ends of the leads of the electric circuit element are contained in the molding.

A further object is to provide opposite channels in an integrated circuit module having inclined bases to provide a wedging effect between the portions of the leads of the electric circuit element extending along these inclined bases and inclined contact surfaces of contact members of a carrier member for carrying the module.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purposes of illustration in order that others skilled in the art may fully understand the invention and the principles thereof and the manner of applying it in practical use so that they may modify it in various forms, each as may be best suited to the conditions of a particular use.

Figure 2:
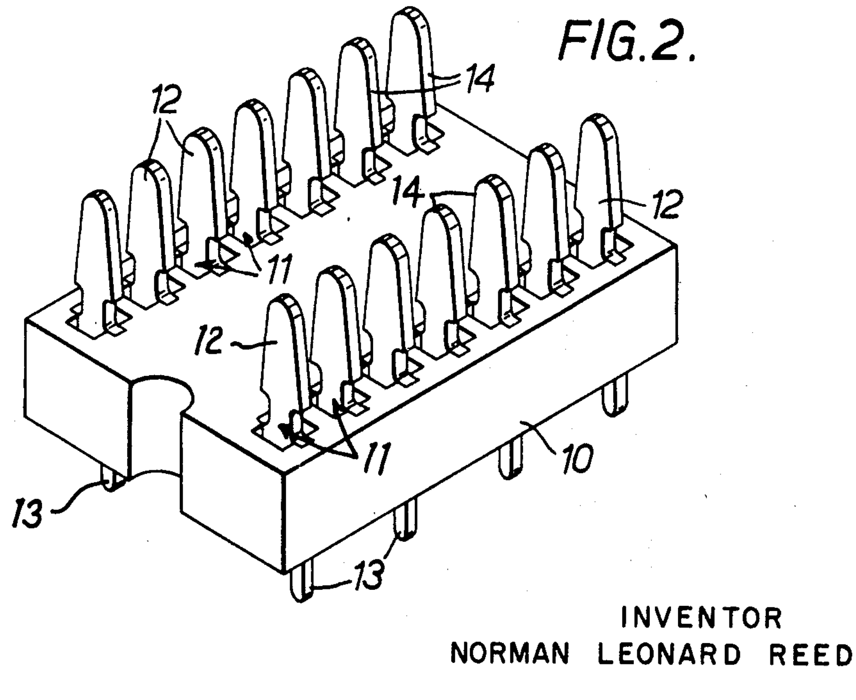

The invention will be described, by way of example, with reference to the accompanying drawings, in which:

FIG. 1 is a perspective view of an integrated circuit module, portions being broken away for illustration; and FIG. 2 is a perspective view of a carrier to receive the module of FIG. 1.

The integrated circuit module, FIG. 1, comprises a generally slablike molding 1 of dielectric material in which an electric circuit element, not shown, is encapsulated. Projections 3 extend outwardly of each of the longer sides 2 of the molding 1 in generally parallel relation and adjacent projections 3 define channels 4 extending the thickness of the molding 1. Each channel 4 is formed with a base 5 in one of the longer sides 2 of the molding 1 and the base 5 is inclined towards the respective channel on the other of the longer sides 2, so that each pair of channels 4 across the molding 1 defines a wedge.

The circuit element, not shown, has leads extending outwardly of the molding 1, each lead having a first end portion 6 and a second end portion 7, the end portions being separated by an intermediate portion 8. The end portion 6 extends away from the circuit element towards the respective channel 4, where it is bent to form the intermediate portion 8, which lies contiguous with the base 5 of the channel 4. The intermediate portion 8 is so bent inwardly of the molding 1 at a point remote from the end portion 6 that the end portion 7 lies trapped within the molding 1 generally parallel to and spaced from the end portion 6. The intermediate portion 8 is arranged to lie contiguous with the channel base 5 inwardly of the ends 9 of the channel 4. In this arrangement, only the intermediate portion 8 of each of the leads is located exteriorly of the molding 1 and that portion is protected from damage by the projections 3 defining the channel 4 and by its disposition away from the ends 9 of the channel 4. The leads may be assembled with facility in the desired position in making the molding 1.

The module of FIG. 1 is preferably connected into an electrical circuit in an assembly including a carrier 10, FIG. 2. The carrier 10 comprises a generally slablike block of dielectric material through which two spaced rows of spaced electrically conductive contacts 11 are fixed. Each contact 11 includes a contact portion 12 projecting from the one surface, the upper as shown in FIG. 2, of the carrier 10 and a pin portion 13 projecting from the other, lower surface for connection with printed circuitry, not shown. Every other pin 13 along one side of carrier 10 forms an outer row of pins while the remainder of the pins 13 form an inner row of pins. The row of posts 11 and adjacent posts are so spaced apart that when the module of FIG. 1 is mounted on the carrier 10, the contact portions 12 of the posts 11 extend within the respective channels 4 of the module 1. The contact portions 12 are formed with contact surfaces 14 which have substantially the same inclination as the bases 5 of the channels 4 in the molding 1. On pressing the module firmly towards the carrier 10, the contact surfaces 14 of the posts 11 make electrical contact with the lead portions 8 by a wedging action between the inclined bases 5 of the channels 4 and the contact surfaces 14.

It will, therefore, be appreciated that the aforementioned and other desirable objects have been achieved; however, it should be emphasized that the particular embodiment of the invention, which is shown and described herein, is intended as merely illustrative and not as restrictive of the invention.

The invention is claimed in accordance with the following:

1. An integrated circuit module comprising a generally slablike unitary molding of dielectric material formed on opposite sides with projections spaced apart longitudinally of the molding and defining channels having bases and sidewalls and extending through the thickness of the molding, the bases of the channels on opposite sides of the molding extending to one major surface of the molding, a circuit element encapsulated within the molding and having leads connected thereto, the ends of each lead of the circuit element being contained within the molding, a portion of each lead intermediate the ends lying within a respective channel and contiguous with the channel base, said projections serving to protect the leads against damage during handling of the module.